United States Patent [19]
Wei

[11] Patent Number: 5,369,303
[45] Date of Patent: Nov. 29, 1994

[54] SELF-ALIGNED CONTACT PROCESS

[75] Inventor: Che-Chia Wei, Plano, Tex.

[73] Assignee: SGS-Thomson Microelectronics, Inc., Carrollton, Tex.

[21] Appl. No.: 116,050

[22] Filed: Sep. 2, 1993

Related U.S. Application Data

[63] Continuation of Ser. No. 786,019, Oct. 13, 1991.

[51] Int. Cl.[5] .................. H01L 29/78; H01L 29/44
[52] U.S. Cl. ..................................... 257/751; 257/767; 257/758; 257/774
[58] Field of Search ............ 357/71, 23.1, 23.3, 357/67; 257/767, 751, 774, 758

[56] References Cited

U.S. PATENT DOCUMENTS

| | | | |
|---|---|---|---|
| 4,743,564 | 5/1988 | Sato et al. | 257/767 |
| 4,855,798 | 8/1989 | Imamura et al. | 357/71 |
| 4,922,311 | 5/1990 | Lee et al. | 357/23.1 |
| 5,043,790 | 8/1991 | Butler | 357/71 |
| 5,075,762 | 12/1991 | Kondo et al. | 357/71 |

FOREIGN PATENT DOCUMENTS

0236123A2 9/0987 European Pat. Off. .
0315229A2 5/1089 European Pat. Off. .

OTHER PUBLICATIONS

IBM Technical Disclosure Bulletin, vol. 32, No. 4A, Sep. 1989, New York, United States pp. 344–345.
IBM Technical Disclosure Bulletin, vol. 33, No. 6A, Nov. 1990, New York, United States p. 470, paragraph 1; and p. 471, paragraph 2.

*Primary Examiner*—Jerome Jackson
*Attorney, Agent, or Firm*—Kenneth C. Hill; Lisa K. Jorgenson; Richard K. Robinson

[57] ABSTRACT

A method for forming a self-aligned contact utilizes a thin insulating layer formed on the upper surface of a conductive layer. A barrier layer is deposited over the insulating layer, and gate electrodes are then defined. Sidewall spacers are formed along the vertical sidewalls of the gate electrodes. During formation of the sidewall spacers the barrier layer protects the gate electrodes. A second insulating layer is then deposited and a via is opened to the substrate. A contact can now be created by depositing conductive material into the via.

7 Claims, 3 Drawing Sheets

SELF-ALIGNED CONTACT PROCESS

This is a continuation of application Ser. No. 07/786,019 filed Oct. 31, 1991.

BACKGROUND OF THE INVENTION

1. Field of the Invention

The present invention relates generally to semiconductor integrated circuits, and more specifically to the formation of self-aligned contacts in an integrated circuit.

2. Description of the Prior Art

In manufacturing high density integrated circuits, improving processing steps to allow for increased utilization of the area on a device is a concern. Masking layers are frequently used in the fabrication of an integrated circuit. When using a mask, it is important to account for errors in alignment between the mask and the device. Typically, this is done by building alignment tolerances into the size of the mask. During the manufacturing process, these tolerances add up such that the amount of available space on the device is reduced.

The self-aligned contact is widely used in high density circuits in order to save area. One approach to forming a self-aligned contact is to use a thick layer of oxide on top of a conductive layer in a gate. The purpose of the thick oxide layer is to protect the conductive layer during subsequent processing steps.

Typically, anisotropic etches are performed when fabricating gates and vias in an integrated circuit. It is common to overetch a layer to ensure complete removal of the material. The thick oxide protects the conductive layer from being etched into during formation of the gates and vias. This prevents the conductive layer from connecting to an active area in the substrate, which would result in shorting out the component.

The thick oxide required in this process, however, increases the severity of the topography of the device. As one skilled in the art will recognize, the severe topography makes subsequent processing steps more difficult. Tall features result in step coverage problems for later interconnect layers.

Therefore, it would be desirable to provide a method for forming self-aligned contacts which results in a more planar topography, without significantly increasing the complexity of the manufacturing process.

SUMMARY OF THE INVENTION

It is therefore an object of the present invention to provide a method for forming self-aligned contacts which have reduced height and are more nearly planar with the upper surface of the semiconductor substrate.

It is another object of the present invention to provide such a method and structure which is compatible with standard process flows, and which add minimal additional complexity to the fabrication of a typical integrated circuit.

Therefore, according to the present invention, a method for forming a self-aligned contact utilizes a thin insulating layer formed on the upper surface of a conductive layer. A barrier layer is deposited over the insulating layer, and gate electrodes are then defined. Sidewall spacers are formed along the vertical sidewalls of the gate electrodes. During formation of the sidewall spacers the barrier layer protects the gate electrodes. A second insulating layer is then deposited and a via is opened to the substrate. A contact can now be created by depositing conductive material into the via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
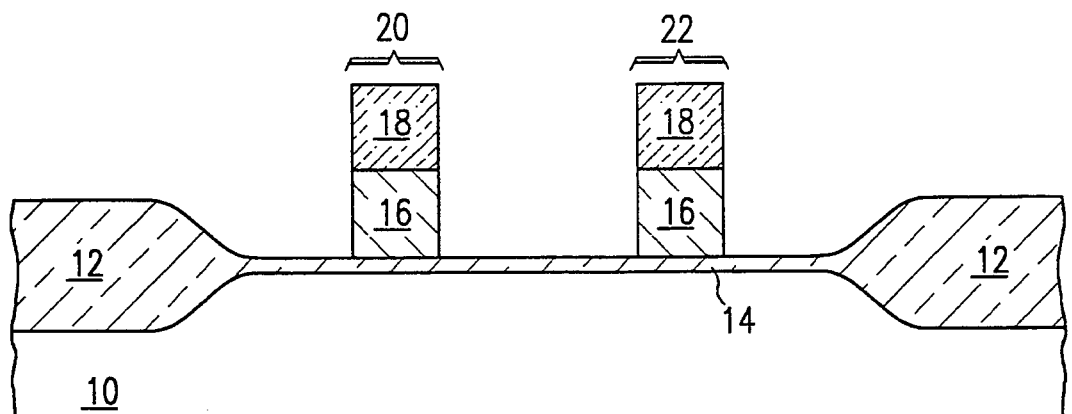
FIGS. 1 and 2 are sectional views illustrating a prior art method for forming a self-aligned contact.
Figure 2:
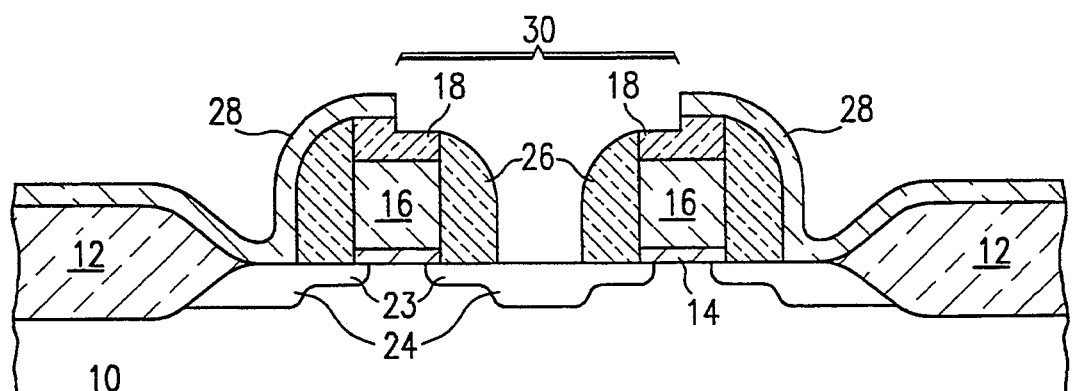

FIGS. 1 and 2 depict a prior art process used to form a self-aligned contact. Referring to FIG. 1, a self-aligned contact will be fabricated on a substrate 10. Isolation regions of field oxide 12 are formed in and on the substrate 10, and a thin layer of gate oxide 14 is then grown on the exposed areas of the substrate 10. A conductive layer 16 is deposited over the device, followed by an insulating layer 18. Typically, the conductive layer 16 is made from polycrystalline silicon, and is approximately 4000 angstroms thick. The insulating layer 18 is made from oxide, and is approximately 3500 angstroms thick. As will be explained in greater detail below, initially the insulating layer 18 must be thick in order to protect the conductive layer 16 during subsequent processing steps. A masking layer (not shown) is then deposited and patterned on the device. An anisotropic etch is performed to define the gate electrodes 20, 22.

Referring to FIG. 2, lightly doped drain regions 23 are formed in the substrate 10. A layer of oxide is deposited over the device and sidewall spacers 26 are created along the vertical sidewalls of the gate electrodes 20, 22, by anisotropically etching the layer. Source and drain regions 24 are formed in the substrate 10. A conformal layer 28 of oxide is then deposited over the device, and a via 30 is opened anisotropically etching the device.

As one skilled in the art will recognize, overetching a layer is common to ensure complete removal of the material. As a result of overetching during formation of the sidewall spacers 26 and the via 30, the initial thickness of the insulating layer 18 is decreased. Typically, after formation of the sidewall spacers 26 the insulating layer 18 is approximately 1000–2000 angstroms thick. After opening a via, a part of the insulating layer in the via is etched away, leaving that portion of the layer approximately 500 angstroms thick. Because the insulating layer 18 protects the conductive layer 16 from exposure during formation of the sidewall spacers 26 and the via 30, a certain minimum thickness is needed to guarantee protection of the gate electrodes 20, 22.

However, when the gate electrodes 20, 22 are complete, and the via is opened, the topography of the device is now a problem for subsequent processing steps. Materials later deposited on the device may not adequately cover some areas due to the height and contour of the gate electrodes 20, 22 and the via 30.

Figure 3:
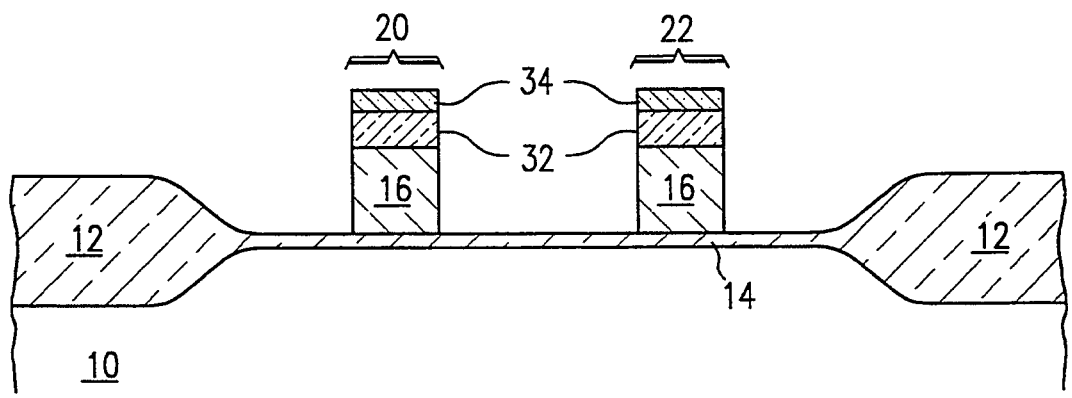
FIGS. 3–9 are sectional views illustrating a preferred method for forming a self-aligned contact according to the present invention.

FIG. 3 illustrates formation of the gate electrodes 20, 22 according to the present invention. Isolation regions of field oxide 12 are formed in and on the substrate 10, and a thin layer of gate oxide 14 is then grown on the exposed areas of the substrate 10. A conductive layer 16 is deposited over the device, followed by a thin insulating layer 32. As described in connection with FIGS. 1 and 2, the conductive layer 16 can be made from polycrystalline silicon, and is approximately 4000 angstroms thick. The thin insulating layer 32 can be made from oxide, and have a thickness of approximately 500–1000 angstroms. A barrier layer 34 is then deposited over the device. The barrier layer can be made from any material with a high etch selectivity to the material in the insulating layer 32. In this example, the barrier layer 34 can be made from titanium nitride, which has a high etch selectivity to oxide. The thickness of the barrier layer can be approximately 300–500 angstroms. A masking layer (not shown) is then deposited and patterned on the device. An anisotropic etch is performed to define the gate electrodes 20, 22.

Figure 4:
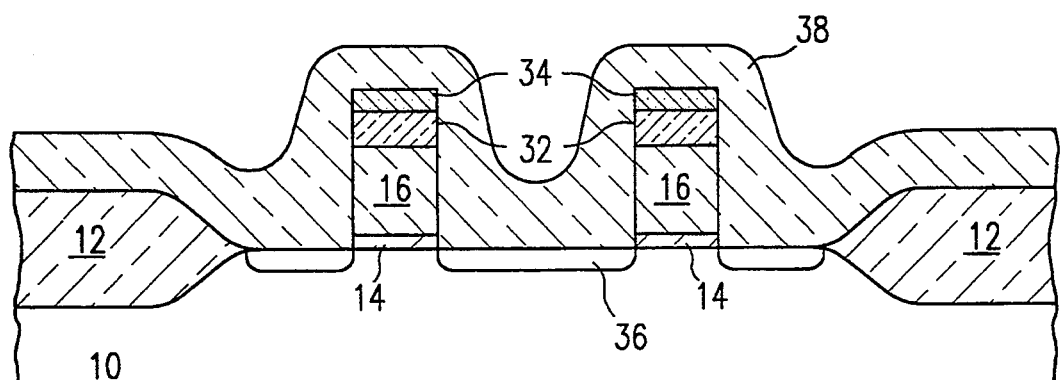

Referring to FIG. 4, a lightly doped drain region 36 is formed in the substrate 10. A conformal layer 38 of oxide is then deposited over the device.

Figure 5:
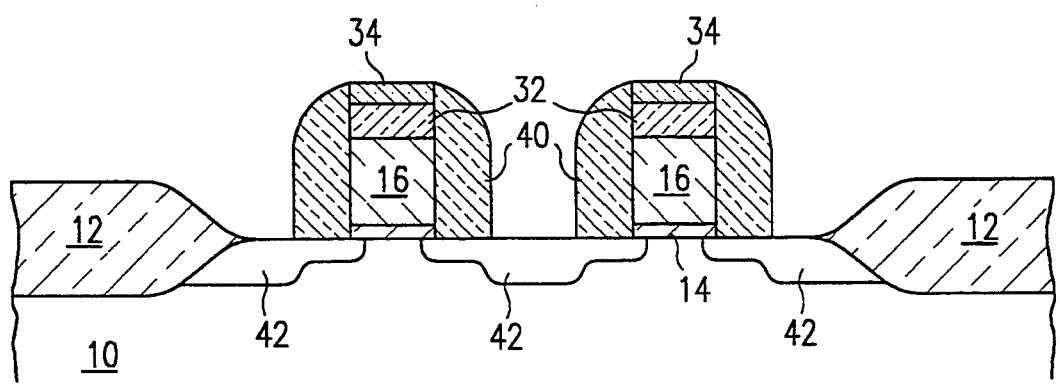

FIG. 5 illustrates the device after sidewall spacers 40 have been created, and source drain regions 42 have been formed. The barrier layer 34 protects the insulating layer 32 and the conductive layer 16 during the anisotropic etch performed to create the sidewall spacers 40.

Figure 6:
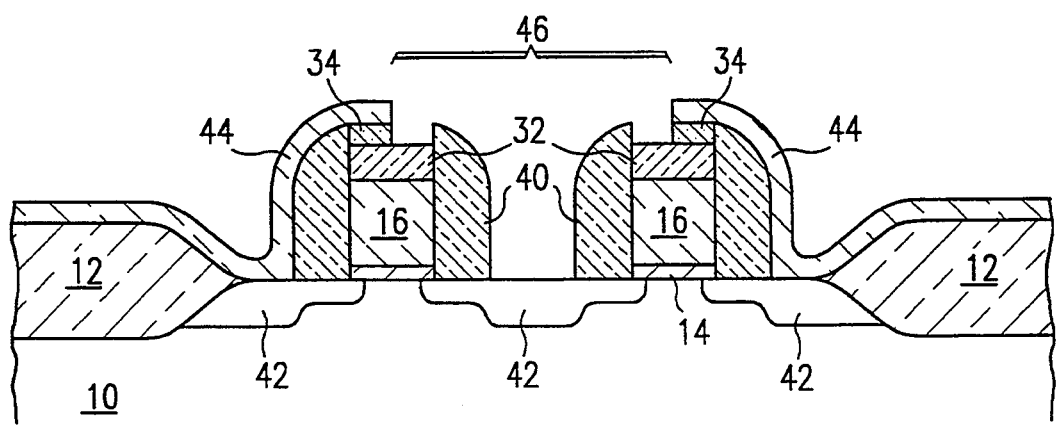
Figure 7:
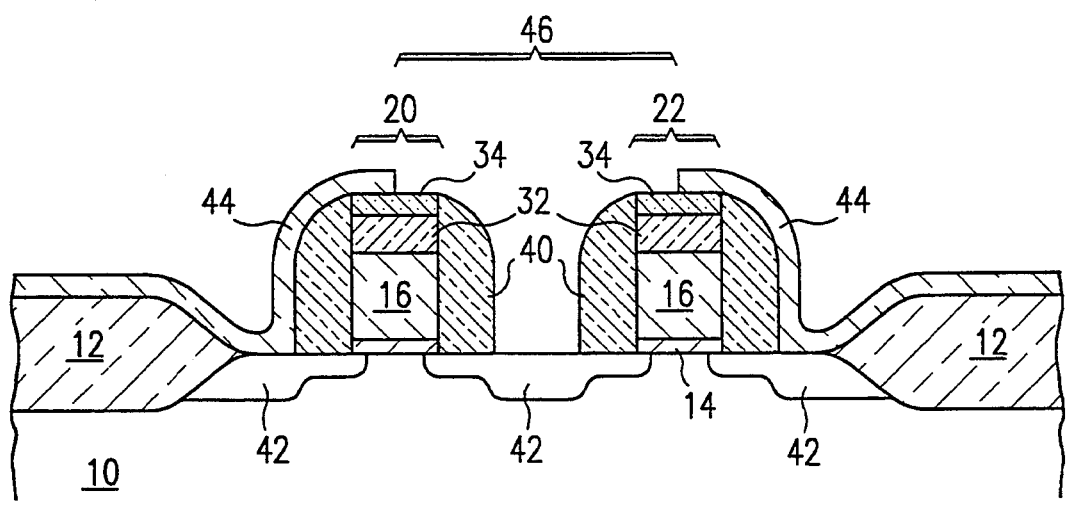
Figure 8:
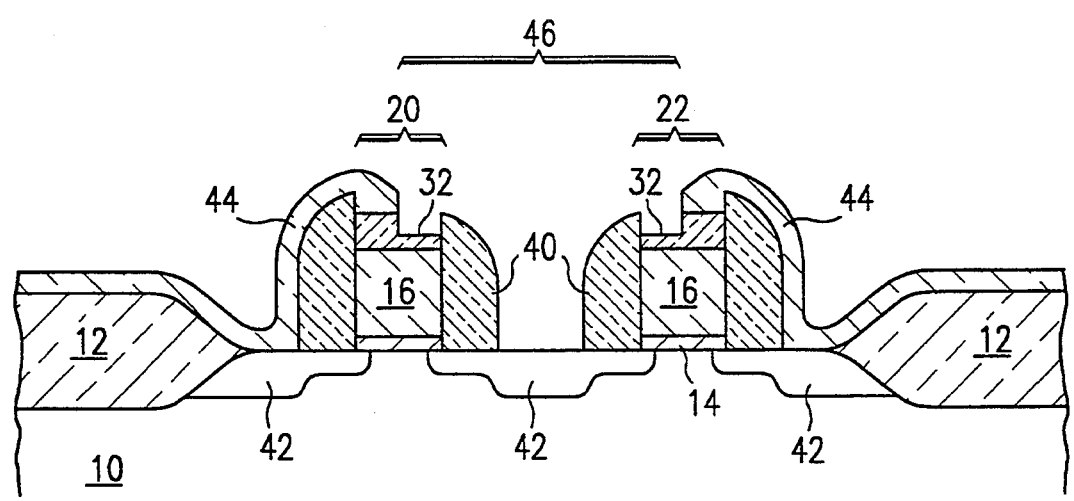

FIGS. 6–8 illustrate several alternative methods which can be used to complete the self-aligned contact. In FIG. 6, a conformal insulating layer 44 is deposited over the device. A masking layer (not shown) is deposited and patterned on the device, and an anisotropic etch is performed to open a via 46. The barrier layer 34 again protects the insulating layer 32 and the conductive layer 16 from damage during the etch. A portion of the barrier layer 34 is then removed, typically by performing a wet etch. The area of the barrier layer 34 closest to the via 46 can be oxidized, thereby capping the end of the remaining barrier layer 34. As those skilled in the art will appreciate this is especially desirable if the remaining barrier layer 34 is made from a conductive material. A contact may be formed by depositing conductive material into the via 46.

FIG. 7 illustrates an alternative to removing a portion of the barrier layer 34. If the barrier layer 34 is made from material that is not conductive, it is possible to leave it on top of the gate electrodes 20, 22. If the barrier layer 34 is made from material that is conductive, it can be oxidized and left on top of the gate electrodes 20, 22. A conformal insulating layer 44 of oxide is then deposited over the device. A masking layer (not shown) is deposited and patterned on the device and an anisotropic etch is performed to open a via 46. The barrier layer 34 again protects the insulating layer 32 and conductive layer 16 from damage during the etch. A contact may now be formed by depositing conductive material into the via 46.

Referring to FIG. 8, the barrier layer 34 is completely removed from the gate electrodes 20, 22 before the via 46 is opened. Typically this is done by performing an isotropic etch. The conformal insulating layer 44 is then deposited over the device. The via 46 is opened, and a contact can be formed by depositing conductive material into the via 46.

Figure 9:
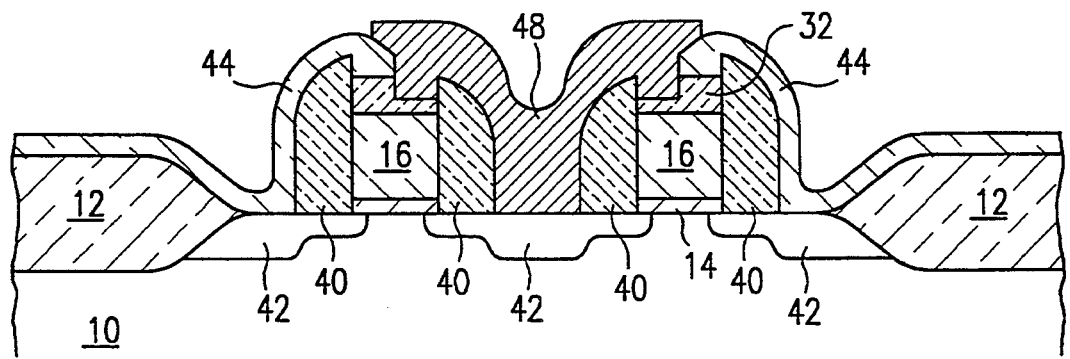

FIG. 9 illustrates the self-aligned contact once these processing steps are complete, and a conductive contact is created by depositing conductive material 48 into the via 46. The conductive material 48 can be, for example, made from silicided polycrystalline silicon. One skilled in the art will recognize that this conductive material 48 can be used in conjunction with the processes described in connection with FIGS. 6 and 7.

According to the present invention, the thickness of the insulating layer 18 can be reduced from approximately 3500 angstroms to approximately 1000 angstroms through the use of a barrier layer 34. The total height of the gate electrodes 20, 22 can be reduced from approximately 6000 angstroms to approximately 4000 angstroms. This reduction in height will improve the topography and make further processing of the device easier and more effective.

While the invention has been particularly shown and described with reference to a preferred embodiment, it will be understood by those skilled in the art that various changes in form and detail may be made therein without departing from the spirit and scope of the invention.

What is claimed is:

1. A structure for an integrated circuit, comprising:
   a semiconductor substrate;
   a gate electrode;
   a first insulating layer on an upper surface of the gate electrode;
   a barrier layer, having an upper surface and containing a metallic conductor and a metal oxide insulator, covering an upper surface of the first insulating layer;
   sidewall spacers alongside vertical sidewalls of the gate electrode, the first insulating layer and the barrier layer; and
   a second insulating layer overlying a portion of the barrier layer;
   wherein the barrier layer metal oxide insulator covers the barrier layer upper surface not covered by the second insulating layer.

2. A structure for an integrated circuit, comprising:
   a semiconductor substrate;
   a gate electrode;
   a first insulating layer on an upper surface of the gate electrode;
   a barrier layer, having an upper surface and containing a metallic conductor and a metal oxide insulator, covering a portion less than the entirety of an upper surface of the first insulating layer;
   sidewall spacers alongside vertical sidewalls of the gate electrode, the first insulating layer and the barrier layer; and
   a second insulating layer overlying the barrier layer;
   wherein an end portion of the barrier layer aligned with a side of the second insulating layer is formed from the metal oxide insulator, with the remainder of the barrier layer formed from the metallic conductor.

3. The structure for an integrated circuit of claim 1, wherein the barrier layer can be highly selectively etched over oxide, and wherein oxide can be highly selectively etched over the barrier layer.

4. The structure for an integrated circuit of claim 3, wherein the metallic conductor comprises titanium nitride, and the metal oxide insulator comprises titanium oxide.

5. The structure for an integrated circuit of claim 3, wherein the barrier layer metal oxide insulator covers the entire barrier layer upper surface.

6. The structure for an integrated circuit of claim 2, wherein the barrier layer can be highly selectively etched over oxide, and wherein oxide can be highly selectively etched over the barrier layer.

7. The structure for an integrated circuit of claim 2, wherein the metallic conductor comprises titanium nitride, and the metal oxide insulator comprises titanium oxide.

* * * * *